US008875075B2

(12) United States Patent
Kennedy et al.

(10) Patent No.: US 8,875,075 B2
(45) Date of Patent: Oct. 28, 2014

(54) GENERATING PATTERN-BASED ESTIMATED RC DATA WITH ANALYSIS OF ROUTE INFORMATION

(75) Inventors: Christopher Kennedy, Stow, MA (US); Changge Qiao, Santa Clara, CA (US)

(73) Assignee: Synopsys, Inc., Mountain View, CA (US)

(*) Notice: Subject to any disclaimer, the term of this patent is extended or adjusted under 35 U.S.C. 154(b) by 0 days.

(21) Appl. No.: 13/528,807

(22) Filed: Jun. 20, 2012

(65) Prior Publication Data

US 2013/0346936 A1    Dec. 26, 2013

(51) Int. Cl.
*G06F 17/50*    (2006.01)

(52) U.S. Cl.
USPC .......................................................... 716/110

(58) Field of Classification Search
USPC .................................................. 716/110–117
See application file for complete search history.

(56) References Cited

U.S. PATENT DOCUMENTS

| | | | |
|---|---|---|---|
| 6,189,131 B1* | 2/2001 | Graef et al. ................... | 716/113 |
| 6,243,851 B1* | 6/2001 | Hwang et al. ................. | 716/121 |
| 6,292,925 B1* | 9/2001 | Dellinger et al. ............. | 716/113 |
| 7,853,915 B2 | 12/2010 | Saxena et al. | |
| 2001/0001881 A1* | 5/2001 | Mohan et al. .................... | 716/1 |
| 2004/0117753 A1 | 6/2004 | Kahng et al. | |
| 2008/0163150 A1* | 7/2008 | White et al. .................... | 716/12 |
| 2011/0061037 A1 | 3/2011 | Croysdale et al. | |
| 2011/0061038 A1 | 3/2011 | Qiao et al. | |

OTHER PUBLICATIONS

Non-Final Office Action in U.S. Appl. No. 13/908,769 dated Feb. 19, 2014, 12 pages.

* cited by examiner

*Primary Examiner* — Binh Tat
(74) *Attorney, Agent, or Firm* — HIPLegal LLP; Judith A. Szepesi

(57) ABSTRACT

A method and apparatus for improving physical synthesis of a circuit design is described. In one exemplary embodiment, post-route information of nets in the circuit design is analyzed. The post-route information includes, for each of the nets, a predicted route property, a post-route property, and a set of physical and/or timing attributes for that net. For each of the attributes, a set of attribute ranges is derived for the corresponding attribute to bin the nets into a Gaussian distribution for that attribute. Net routing constraints are generated for the circuit design based on the attribute ranges derived. The net routing constraints are applied to one or more of the nets during subsequent placement-based optimizations of the circuit design.

22 Claims, 8 Drawing Sheets

GENERATING PATTERN-BASED ESTIMATED RC DATA WITH ANALYSIS OF ROUTE INFORMATION

FIELD

The disclosed embodiments relate to circuit design, and more particularly to the physical synthesis of a circuit design.

BACKGROUND

The physical synthesis of a circuit design refers to the process of transforming a gate-level representation of the circuit design into a physical implementation of the circuit design (i.e. a chip layout). Due to the complexity of circuit designs, electronic design automation (EDA) tools are used to perform the physical synthesis. During physical synthesis, components or technology-specific logic gates of the circuit design are assigned to specific locations within a prescribed chip area of the circuit design. Interconnects between the components, referred to as nets, are then wire routed to provide signal connectivity between the components. One of the goals of physical synthesis is to achieve design closure. That is, to create a physical implementation of the circuit design that meets the design's performance, power, signal integrity, and timing objectives.

As technology scaling has caused wire delays to increase relative to gate delays, design closure is becoming more difficult because wire delays introduced during the routing of the circuit design are becoming a significant source of timing violations. As a result, the physical synthesis of a circuit design may take many iterations of optimizing the placement and routing of the circuit design before the timing requirements are met. For complex circuit designs, this may take days to weeks before design closure is achieved. To improve time it takes to reach timing closure, electronic design automation (EDA) tools use wire delay estimates of nets in the circuit design to assist with placement and routing decisions. However, average resistance and capacitance values are used for calculating these delay estimates. This often leads to inaccurate wire delay estimates resulting in little improvement in the overall time it takes to reach design closure.

SUMMARY

A method and apparatus for improving physical synthesis of a circuit design is described. In one exemplary embodiment, information of nets in the circuit design is analyzed. The information includes, for each net, one or more of a predicted route property, a post-route property, and a set of physical attributes. For each of the physical attributes, a set of attribute ranges is derived, to bin the nets into a Gaussian distribution for that physical attribute. Net routing constraints and scaling factors are generated for the circuit design based on the attribute ranges derived. The net routing constraints are applied during placement-based optimizations of the circuit design to improve the accuracy of estimated net delays; this, in turn, improves the correlation of placement-based and routing-based net delays.

BRIEF DESCRIPTION OF THE DRAWINGS

The disclosed embodiments are illustrated by way of example and not limitation in the figures of the accompanying drawings in which like references indicate similar elements.

DETAILED DESCRIPTION

Embodiments of the present invention disclose improved methods and apparatuses for performing physical synthesis of a circuit design by analyzing information to generate net routing constraints that can be used during placement-based optimizations. In one embodiment, statistical analysis is performed on the information to automatically derive attribute ranges to bin the nets into Gaussian distributions. The attribute ranges are then grouped together to form net patterns, in one embodiment. Average scaling factors are computed for the net patterns and are used when computing estimated routing delays (i.e. routing delay estimations) during placement-based optimizations, in one embodiment. These pattern-based average scaling factors according to one embodiment provide improved correlations between post-route delays and estimated routing delays to speed up the overall design flow by enabling physical synthesis to reach design closure in less time. In another embodiment, the net routing constraints including the pattern-based average scaling factors can be saved and reused at a future time during a redesign of the circuit to speed up physical synthesis of the redesign.

Figure 1:
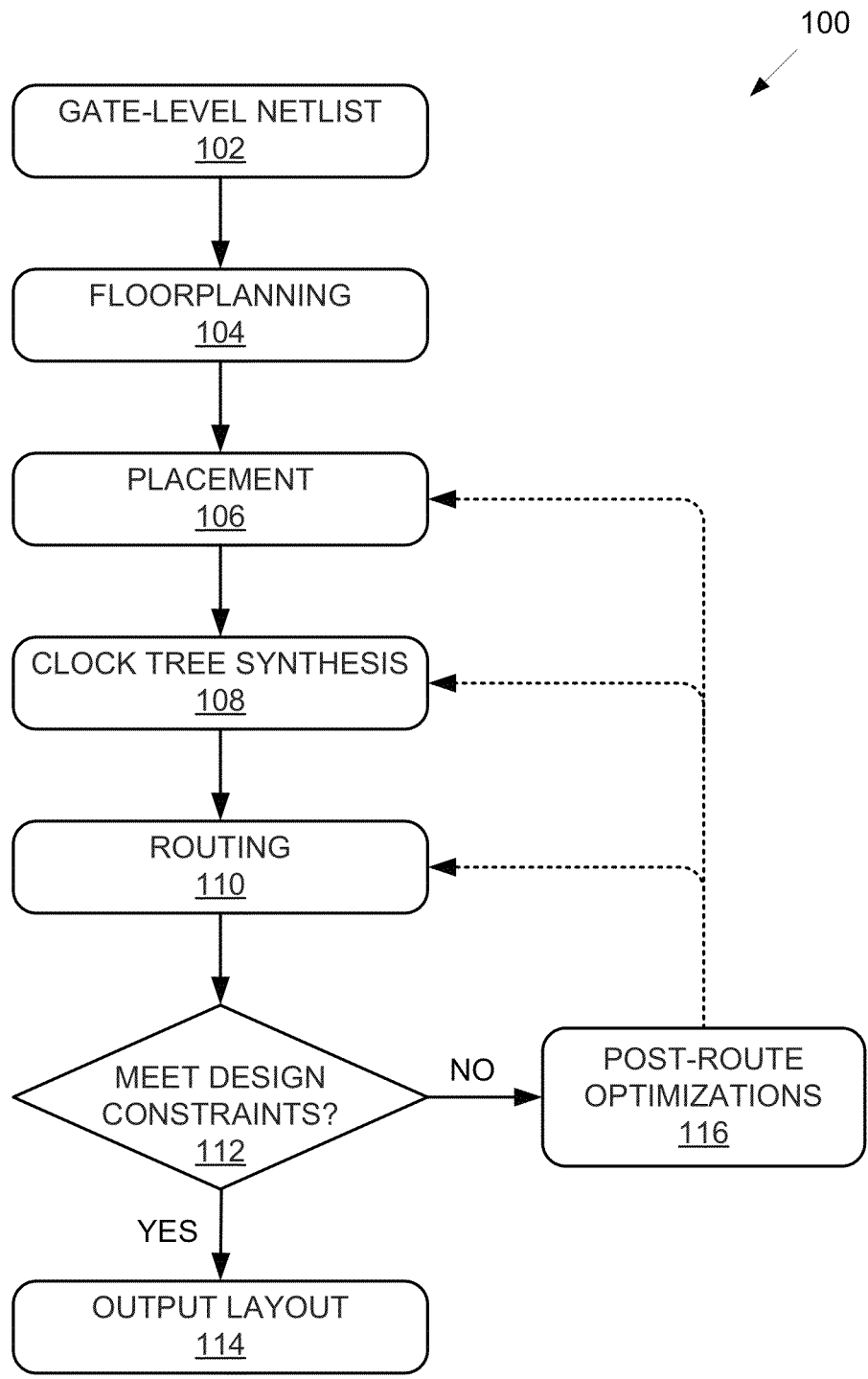
FIG. 1 illustrates a process flow diagram for performing a physical synthesis of a circuit design, according to one embodiment of the invention.

An exemplary flowchart 100 for performing a physical synthesis of a circuit design according to one embodiment is shown in FIG. 1. The physical synthesis starts with generating a gate-level netlist of a circuit design at block 102. The gate-level netlist of the circuit design is a technology-specific gate-level representation of the circuit design. The gate-level netlist is generated in one embodiment by performing a logical synthesis of a register transfer level (RTL) representation of the circuit design. During logical synthesis, the RTL representation is translated into logic gates using a technology-specific gate library. The gate-level netlist may also include one or more pre-designed macro-cells or cores, and/or memory components. Alternative methods of generating the netlist may be used.

At block 104, the floor-planning of the circuit design is performed. Floor-planning refers to assigning relative locations to the logic blocks in the gate level net list. In one embodiment, this includes identifying logic blocks in the gate-level netlist that should be placed close together, and allocating space within a prescribed chip area to accommodate the physical area of each logic block. The physical area of a logic block includes the space needed for all components in the logic block (i.e. the technology-specific logic gates) as well as any routing area needed to interconnect the components within the logic block. The floor-planning takes into account the routing area needed to connect together the different logic blocks in the circuit design including any pre-designed macro-cells or cores and/or memory components.

At block 106, initial placement of the individual components (i.e. the technology-specific logic gates) in each logic block of the circuit design is performed. Nets providing connectivity between two or more pins of components in the circuit design are preliminarily routed to assess how the net connectivity may be implemented. This allows routing delays to be calculated, to provide estimates of what the actual routing delays will be. Based on the estimated routing delays based on the preliminary routing, components that are on timing critical paths can be placed closer together to shorten the signal path, and components that are not on timing critical paths can be moved farther apart to reduce congestion in a particular area.

At block 108, the clock tree synthesis of the circuit design is performed, in one embodiment. During clock tree synthesis, routing is added for one or more clock signals to be routed to the different logic blocks. The clock signals are routed in a way to keep the clock skew between different logic blocks at a minimum. Clock buffers may be inserted during clock tree synthesis at different locations to adjust the skew and/or to improve the signal integrity of the clock signals.

Once the clock tree has been synthesized, at block 110, signal routing is performed to generate a layout of the circuit design. During signal routing, nets in the circuit design are implemented with routes. The actual routes may differ from the preliminary routes. For example, a route may be routed in a different routing layer, take on a different topology, or routed around an obstacle, in order to avoid congested regions or to reduce crosstalk between adjacent signals. During signal routing, in one embodiment, routing delays may be computed and recomputed to explore different routing options.

When all signals in the circuit design have been successfully routed, at block 112, a physical verification of the chip layout is performed to determine if the chip layout meets the design constraints of the circuit design. The physical verification may include post-route timing analysis, signal-integrity analysis, and other design rule verification. If the design constraints are met, and there are no timing or other violations (i.e. design closure is achieved), at block 114, the chip layout of the circuit design is finalized. In one embodiment, the circuit design is output in a format that can be sent used for fabrication. The process then ends.

If the design constraints are not met, post-route optimization is performed at block 116. Post-route optimization refers to optimization performed after a first routing is completed. In one embodiment, the first routing attempt is typically a low-effort routing attempt, and design closure is rarely achieved after the first routing attempt. The post-route optimization is performed to resolve design violations in the first routing attempt, and typically involve altering at least a part of the circuit design. In one embodiment, this may include re-routing as described with reference to block 110, rearranging the placement of the circuit design at block 106 and/or re-synthesizing the clock tree at block 108. The post-route optimizations are performed iteratively, in one embodiment, and are repeated until the chip layout meets the design constraints, at block 112, to reach design closure.

As discussed above, during the placement and routing stages of the physical synthesis, in one embodiment nets are preliminarily routed to compute preliminary routing delays to assist with placement and routing decisions. However, the preliminary routing delays computed prior to completion of signal routing often have imperfect correlation to the delays of the actual routes implemented during signal routing. This miscorrelation can lead to suboptimal placement of components and/or suboptimal routing topologies resulting in additional iterations of post-route optimization before design closure is achieved.

In one embodiment, three main contributors to the signal delay introduced by routing are the parasitic resistance of the wire, parasitic capacitance of the wire, and via count. One reason for the miscorrelation between the preliminary routing and the actual routing delays is that the estimated resistance used in the computation of the preliminary routing delay is an average resistance of all routing layers in the circuit design. However, upper metal layers sometimes have a much lower resistance than lower routing layers. As a result, if the actual wire route of a net is routed in mostly upper layers or mostly lower layers, the actual resistance may be very different from the predicted route resistance that is used in computing the preliminary route delay. The routing layers have different resistance because of the variations in the metal profiles used in the various routing layers. Generally, the metal traces and vias in the upper routing layers are wider than the lower routing layers because vias connecting the different routing layers are typically formed from the top down.

Figure 2:
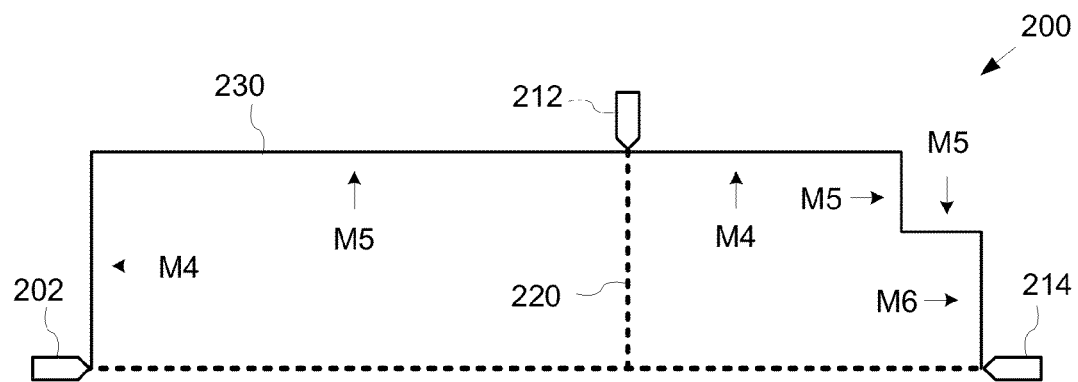
FIG. 2 illustrates an exemplary net in a circuit design.

For example, FIG. 2 shows a net 200 that connects pins 202 to pins 212 and 214 in a circuit design. Pin 202 is the driver of the net 200, and pins 212 and 214 are the receiver or destination pins. Pins 212 and 214 may be inputs to other components. Thus, the net 200 has a fan-out of 2. The preliminary route 220 of the net 200 is represented by the dashed line. The estimated resistance of the preliminary route 220 of net 200, calculated using the average resistance of all routing layers, is 3.134 Kilo Ohms (kΩ). When the net 200 is actually routed, the wire route 230 represented by the solid line, is implemented in mostly upper routing layers (e.g., layers M4 to M6) as indicated. As a result, the actual route 230 routed on the upper routing layers has an real post-route resistance of 0.377 kΩ. This is a difference of 732% between the estimated resistance used in computing preliminary route delay of the net and the actual post-route resistance of net 200. Therefore, recalculating signal delays after routing may alter the circuit design.

Figure 3:
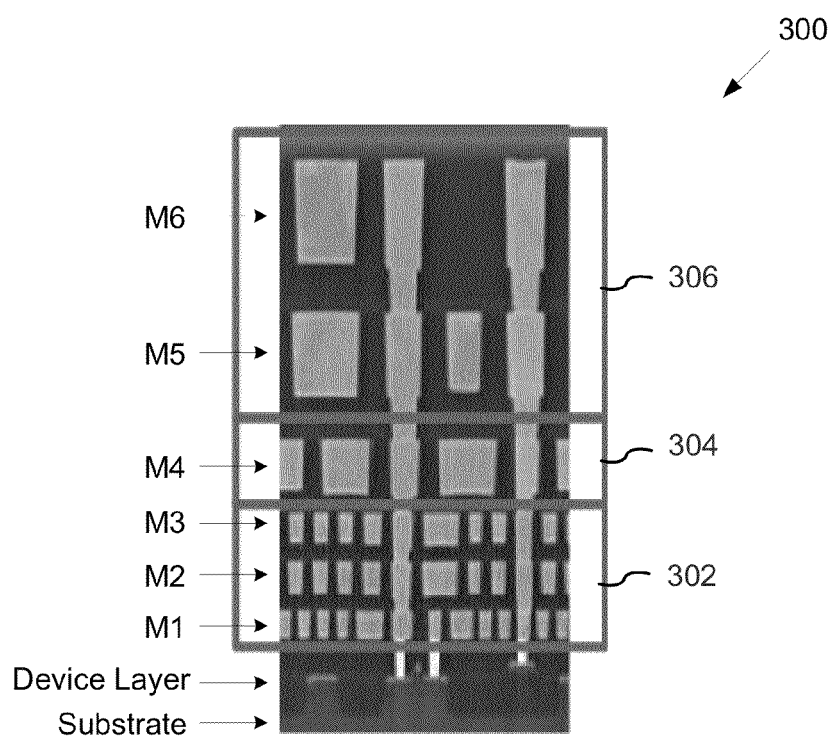
FIG. 3 illustrates an exemplary cross section of routing layers of a circuit design.

FIG. 3 illustrates an exemplary cross section 300 of the routing layers of a circuit design that uses a 130 nanometer (nm) manufacturing process. A 130 nm manufacturing process may have 3 different metal profiles 302, 304, and 306 across six routing layers M1 to M6 as shown. In one embodiment, the bottom routing layers M1, M2, and M3 may form one metal profile 302 having one resistance value. In one embodiment, the middle routing layer M4 may form a second metal profile 304 have a second resistance value. In one embodiment, the upper two routing layers M5 and M6 may form a third metal profile 306 having another resistance value. In another embodiment, a different number of metal profiles may be defined.

As the manufacturing process dimensions shrink, the variation in metal profiles across different routing layers increases. For example, for a 45 nm manufacturing process, in one embodiment can be four metal profiles across eight routing layers. For a 32 nm manufacturing process, there can be five metal profiles across eight routing layers. Thus, technology scaling is likely to exacerbate miscorrelations between estimated route delays and actual delays, making design closure harder to achieve during physical synthesis.

To improve the physical synthesis of a circuit design, in one embodiment, scaling factors can be used to compensate for the miscorrelations between the estimated route delays and the post-route calculated delays. A scaling factor is a value that can be used to multiply the estimated resistance and/or estimated capacitance and/or estimated via count of a net when calculating an estimated route delay to provide a better correlation between the estimated route delay and the calculated post-route delay of the net. In one embodiment, the scaling factors can be adjusted and refined in each iteration of the post-route optimization to improve the optimization results.

Instead of using one scaling factor for all nets in the circuit design, in one embodiment, a further improvement can be achieved by using pattern-based scaling factors. With pattern-based scaling factors, different scaling factors can be applied to nets with different net patterns (e.g., nets with different lengths, fanouts, etc.). Nets with different net patterns are expected to have different resistance and capacitance because their routing topologies are expected to be different. For example, short nets that have a fan-out of one (i.e. one pin is driving only one other pin), are likely to be routed in a single routing layer. Long nets that have many fan-outs would likely be routed in multiple layers. The system can compensate for this difference by applying different scaling factors to the estimated resistance/capacitance for these different types of nets to account for the differences in their net patterns.

One way to derive pattern-based scaling factors is to compute individual scaling factors for all nets in the circuit design based on the difference between the estimated resistance/capacitance and the actual post-route resistance/capacitance after an initial routing attempt, and to organize the nets into bins based on some physical attribute of the nets to derive scaling factor trends. For example, nets with an estimated net length between 0-10 microns (μm) can be grouped into one bin to define one net pattern, nets with an estimated net length between 10-20 μm can be grouped into a second bin to define a second net pattern, and so on. An average scaling factor can be computed over the scaling factors of all nets in a bin, and that average scaling factor can be applied to the nets matching the physical attributes of the corresponding bin during subsequent placement-based optimizations. For example, an average scaling factor can be computed for the bin that includes all nets with an estimated net length between 0-10 μm. That average scaling factor can then be applied to nets that have an estimated net length between 0-10 μm during placement-based optimizations to improve the correlation between the estimated route delays and the post-route delays. In one embodiment, a combination of length and fan-out may be used to bin the nets.

Although the process of binning the nets as described above provides an improvement in the correlation between the predicted route delays and the post-route delays, the decisions of how the bins should be organized can be a daunting task when there are thousands or even millions of nets to consider in a circuit design. For example, deciding to bin nets with estimated net lengths between 0-10 μm together to form a net pattern as opposed to nets with estimated net lengths between 0-15 μm can have an impact on the outcome of the physical synthesis because different pattern-based scaling factors would be applied to different sets of nets during placement-based optimizations, depending on how the nets are binned. Moreover, binning the nets one way may be optimal for one circuit design, but binning the nets the same way for another circuit design may be suboptimal due to architectural or other differences in the two circuit designs. Hence, binning the nets simply by length without any statistical analysis may not always provide an optimal result.

Furthermore, the process described above does not take into account potential outliers in each bin that may adversely skew the computed average scaling factor. For example, suppose the bins are organized by the number of fanouts, and there are 1000 nets that have a fan-out of 1. Furthermore, suppose 990 of those nets have a scaling factor in the range of 0.7 to 0.8, and the other 10 nets have a scaling factor in the 100s. The process described above would compute the average scaling factor to be around 1.7 to 1.8 for nets with a fan-out of 1, which is more than twice the scaling factor of 99% of those nets. In such a scenario, instead of improving the post-route optimizations, applying this skewed average scaling factor to nets with a fanout of 1 during placement-based optimization would actually have an adverse impact on the physical synthesis results. Routing delays computed with the skewed scaling factor may identify problematic nets in error, resulting in extra buffers being inserted when they are not necessary.

Figure 4:
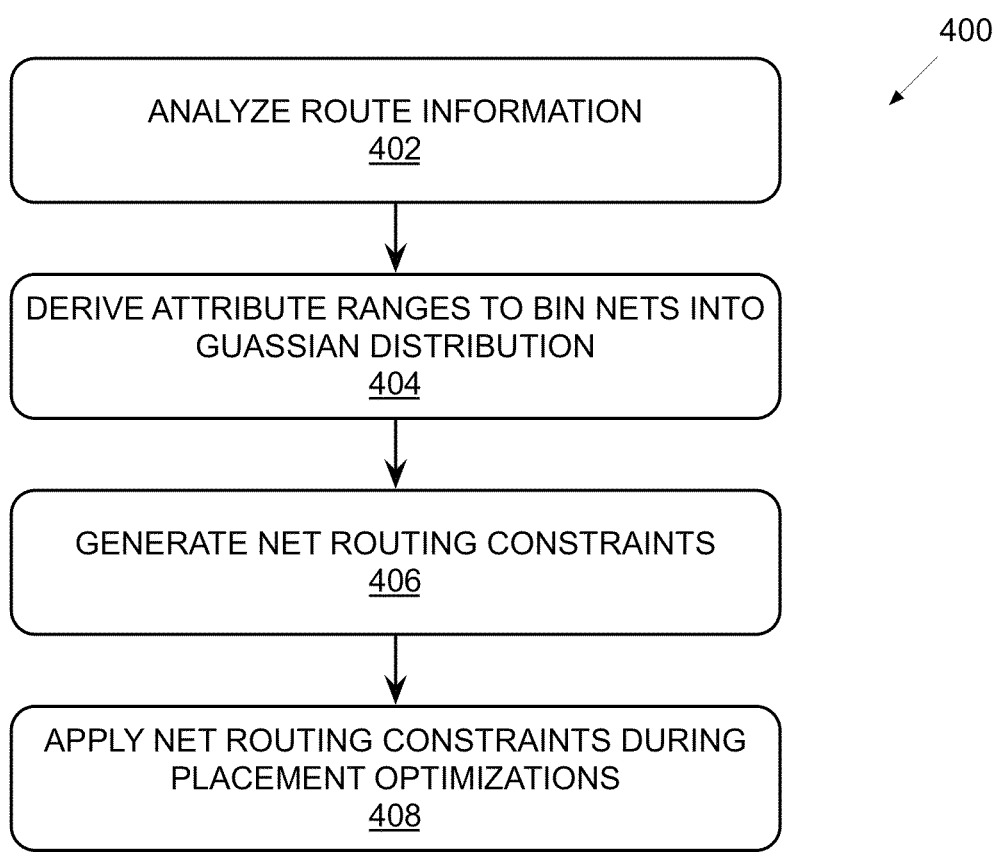
FIG. 4 illustrates a process flow diagram for improving the physical synthesis of a circuit design, according to one embodiment of the invention.

Accordingly, in one embodiment, the system performs a statistical analysis of placement and routing-based information in a circuit design to derive net routing constraints that can be specifically tailored for a particular circuit design. FIG. 4 illustrates a method 400 for improving the physical synthesis of a circuit design according to one embodiment. The method 400 can be implemented in an electronic design automation (EDA) tool executing in a data processing system, and can be performed as part of the placement-based optimizations at block 106 of the physical synthesis process flow 100 of FIG. 1.

At block 402, the placement-based information of nets in a circuit design is analyzed. The placement-based information can be generated by an EDA tool after an initial routing attempt of the circuit design has been performed, or a subsequent iteration of routing optimization that is performed during post-synthesis optimizations. The information in one embodiment includes a list of all nets in the circuit design.

The information further includes, for each net, one or more estimated route properties and corresponding post-route properties, and a set of physical attributes for each net. In one embodiment, the estimated route properties of a net can be an estimated resistance, capacitance, and/or via count of the net, and the corresponding post-route properties of the net can be a post-route resistance, capacitance, and/or via count. The estimated route properties are used during placement and routing to calculate an estimated routing delay to assist with placement and routing decisions. The post-route properties are the actual route properties (e.g., resistance, capacitance, or via count) of the net after wire routing is performed, and are used to calculate the post-route delays (i.e. actual routing delays) to determine if the timing requirements of the design are met to reach design closure.

In one embodiment, the set of physical attributes for each net includes at least one of a fanout, a net length, bounding box attributes, a net type, a blockage coverage ratio, and a congestion factor. The fanout of a net is the number of receiver or destination pins that are driven by the source pin of the net. The net length is the total length of an estimated route that connects all pins of the net. A bounding box is the smallest rectangle that can be drawn around all pins of a net. Other available bounding box attributes are half perimeter length, aspect ratio, and location. In one embodiment, the bounding box aspect ratio is the bounding box height divided by the bounding box width. A blockage coverage ratio is the fraction of a bounding box's blocked area divided by its total area.

The net location is the coordinates of the net relative to the chip layout. In one embodiment, the coordinates of any corner of the bounding box can be used as the net location. In another embodiment, the coordinates of the center of the bounding box can be used as the net location. The net type describes the type of connectivity for that net. In one embodiment, the net types can be one of an input/output (I/O) net, a macro-cell net, or a standard cell net. An I/O net type indicates that the net is providing connectivity to one or more I/O pins. A macro-cell net type indicates that the net is providing connectivity to one or more macro-cell pins. A standard cell net type refers to all other nets. Alternative net types may be defined, like nets that occupy only the topmost level of hierarchy in a design.

A congestion factor can be a vertical congestion factor and/or a horizontal congestion factor that indicates the density of components and/or density of routing along the respective direction in the area within the vicinity of the net. In other embodiments, the set of physical attributes for each net may include other physical attributes of the net.

Referring back to FIG. 4, at block 404, based on the analysis of the post-route information, a set of attribute ranges for each one of one or more physical attributes are automatically derived to bin the nets in the circuit design into a Gaussian distribution for that particular physical attribute. For example, in one embodiment, a first set of attribute ranges can be automatically derived for the estimated net length attribute, and a second set of attribute ranges can be automatically derived for the fan-out attribute. In other embodiments, a set of attribute ranges can be automatically derived for each of any number of physical attributes or for all physical attributes that are available in the post-route information.

Figure 5:
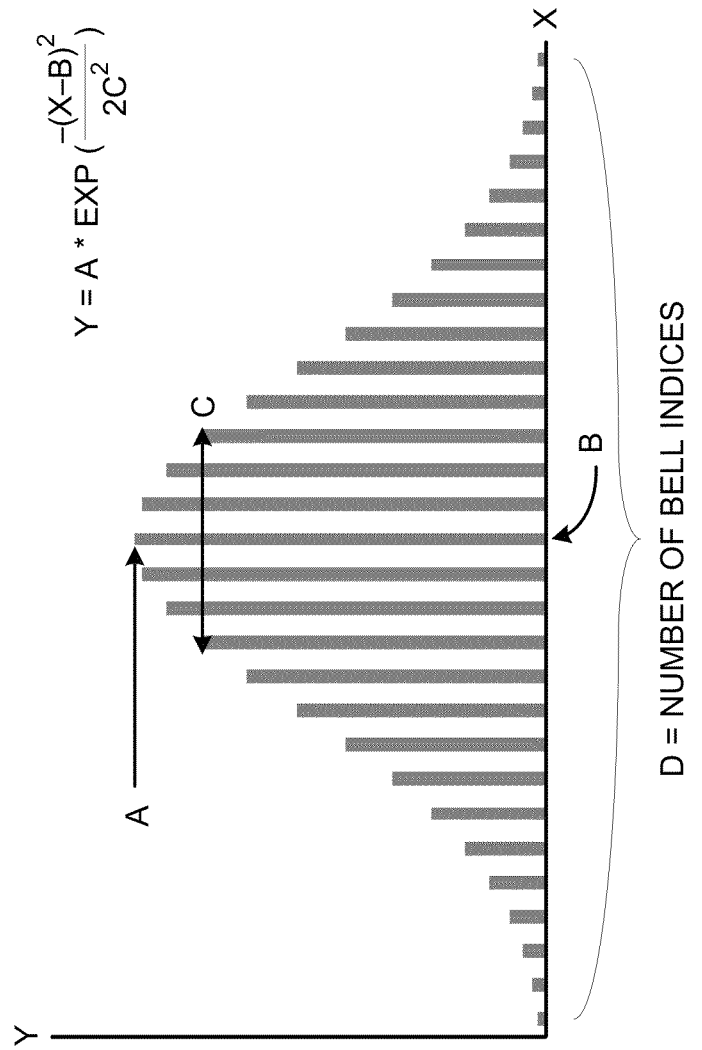
FIG. 5 illustrates an exemplary Gaussian distribution.

FIG. 5 illustrates an exemplary Gaussian distribution. A Gaussian distribution is a bell shape distribution that can be expressed by the equation $Y=A*EXP(-(X-B)^2/2C^2)$, where the point A represents the bell peak of the Gaussian distribution, the point B represents the position on the X-axis of point A, or the bell index, that corresponds to the bell center of the Gaussian distribution. The range C represents the bell width, which is the number of bell indices that make up the interquartile range or typically c. 67% of the Gaussian distribution. An additional bell variable D is used to indicate the total number of bell indices in the Gaussian distribution, which represents the number of bins that the nets are grouped into for a particular physical attribute. Using the bell variables A, B, C, and D, as defined above, different bell shapes of a Gaussian distribution can be characterized by using different values for those bell variables.

In one embodiment, different bell shapes are used for different physical attributes when binning the nets into a Gaussian distribution by using different values for the bell variables A, B, C, and D. For example, in an exemplary embodiment, with respect to the estimated net length attribute, the nets are binned into a Gaussian distribution that has many bins (a large value for the bell variable D) and long tail (a small value for the bell variable C). The reason for this is that the estimated net length attribute is expected to have a wide range of values with various lengths from very short nets to very long nets in a circuit design. With respect to the congestion factor attribute, in one embodiment, the nets are binned into a Gaussian distribution that has a few bins (a small value for the bell variable D) and short tail (a value for the bell variable C that is equal to the bell variable D). The reason for this is that the congestion factor attribute is expected to have a narrow range of values without much variation because components in a circuit design are expected to be fairly evenly distributed throughout the prescribed chip area.

Furthermore, not all physical attributes are binned into Gaussian distributions with bell shapes that are symmetrical around a central peak (i.e. the bell center being in the middle of the number of bell indices), because different physical attributes may have different distributions. For example, for the bounding box aspect ratio attribute, a majority of the nets in a circuit design is expected to have moderate bounding box aspect ratios, and a small number of nets are expected to have very large or very small bounding box aspect ratios. This is likely to occur because a circuit design is expected to have only a small number of long horizontal single fanout nets (very small bounding box ratios) and only a small number of long vertical single fanout nets (very high bounding box ratios). Thus, with respect to the bounding box aspect ratio attribute, the nets can be binned into a Gaussian distribution with a symmetrical bell shape such that bins in the middle of the Gaussian distribution represent moderate bounding box aspect ratios which would have larger net counts.

In contrast, with respect to the estimated net length attribute, the number of short nets is expected to be greater than the number of long nets in a circuit design, because components that are directly connected with each other are expected to be placed close to each other. Hence, for the estimated net length attribute, the nets can be binned into a distribution with a skewed bell shape that has only the right-handed side portion of the bell such that the bins with low bell indices representing shorter estimated net lengths would have large net counts, and bins with high bell indices representing longer estimated net lengths would have small net counts to correspond to the expected trend of the estimated net length attribute.

Although the trends described above apply to most circuit designs, circuit designs can vary greatly in their application, size, and components. Hence, in one embodiment, the system allows the distribution of a physical attribute to be manipulated by changing the values of the bell variables such that different distributions can be explored heuristically to determine if the particular physical attribute has an unexpected trend that deviates from typical circuit designs, and to determine what kind of distribution is better suited for the particular physical attribute of the circuit design.

Figure 6:
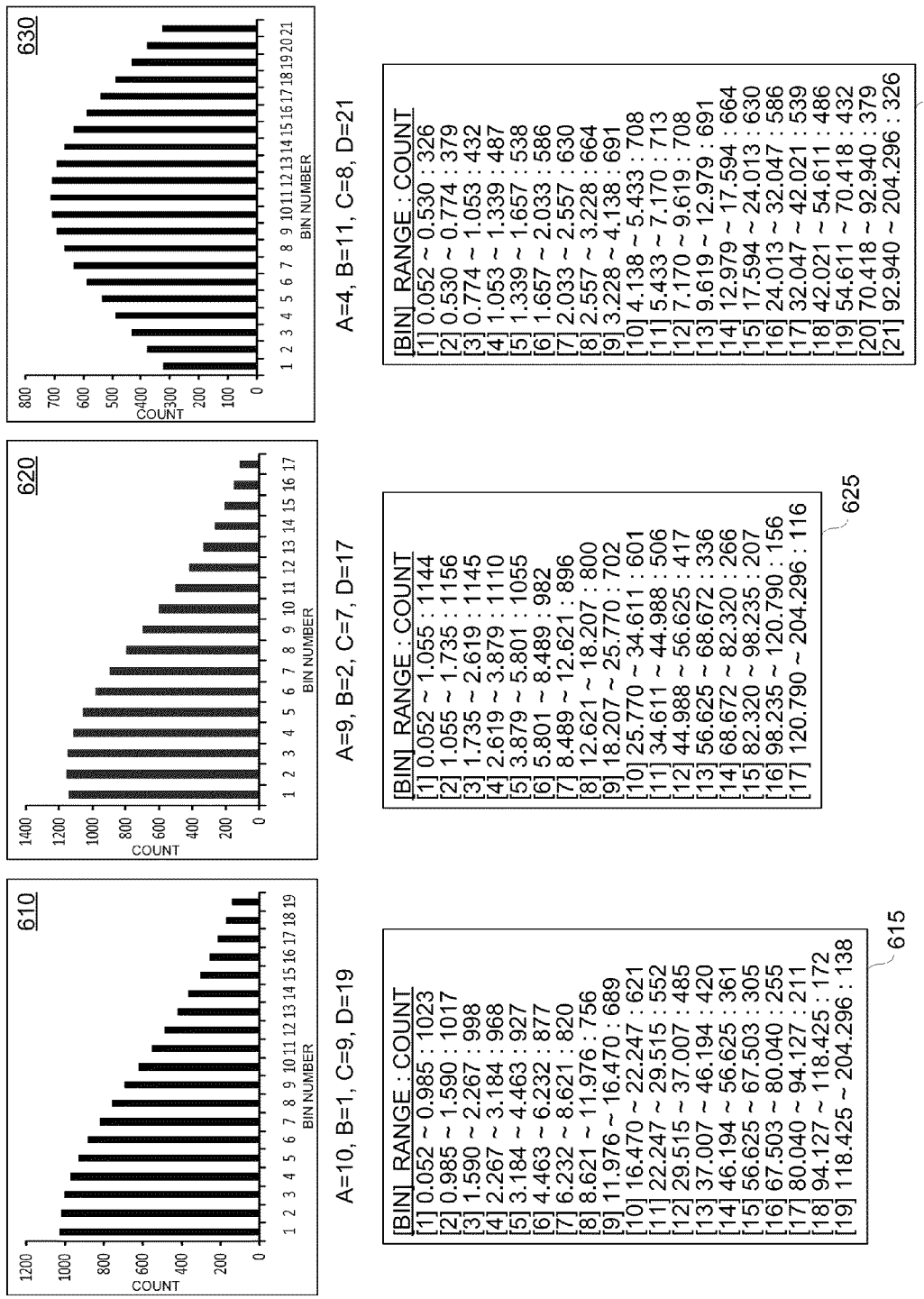
FIG. 6 illustrates exemplary manipulations of a Gaussian distribution according to one embodiment of the invention.

An example of how a distribution can be manipulated according to embodiments of the invention is shown in FIG. 6. In FIG. 6, the nets in an exemplary circuit design are binned according to the estimated net length attribute into distributions of three different shapes 610, 620, and 630.

The exemplary circuit design has 11595 nets with estimated net lengths ranging from 0.052 to 204.296. For the bell shape 610, the bell variables used are A=10, B=1, C=9, and D=19. Hence, for the bell shape 610, the nets are binned into 19 bins with the bell center shifted leftwards to be at the bell index 1. The attribute ranges and net counts automatically derived for this set of bell variables are shown in table 615 below the bell shape 610. The first bin at bell index 1 has a net count of 1023 nets with a derived estimated net length attribute range of 0.052 to 0.985. The second bin at bell index 2 has 1017 nets with a derived estimated net length attribute range of 0.985 to 1.590, and so on. However, the eighteenth bin at bell index 18 has a net count of only 172 nets, and the nineteenth bin at bell index 19 has a net count of only 138 nets.

A different bell shape 620 for the estimated net length attribute can be achieved by changing the bell variables to A=9, B=2, C=7, and D=17. For the bell shape 620, the bell center is shifted to the right by increasing the bell variable B by 1. The bell shape 620 is also made narrower than the bell shape 610 by using different values for the bell variables A, C, and D. The attribute ranges and net counts derived for this set of bell variables are shown in table 625 below the bell shape 620. For both bell shapes 610 and 620, the bins with large bell indices (e.g., bins 18 and 19 of bell shape 610, and bins 16 and 17 of bell shape 620) have net counts that are less than 200 nets, whereas bins with low bell indices have net counts that are greater than 1000 nets. Such disproportionally small net counts for bins at the large bell indices representing long estimated net lengths may lead to skewed net routing constraints to be generated for such nets because of the relatively small sample sizes in those bins.

To increase the net counts for bins representing long estimated net lengths, the Gaussian distribution can be further manipulated into the bell shape 630. The bell variables used for the bell shape 630 are A=4, B=11, C=8, and D=21. The attribute ranges and net counts derived for this set of bell variables are shown in table 635 below the bell shape 630. With this set of bell variables, the bell center lies in the middle of the bell shape 630, and the lowest net count of any bin is increased to at least 300 nets. Hence, by changing the bell variables used for binning the nets into the Gaussian distribution, the net counts can be adjusted such that all bins would have sufficient sample size.

Alternatively, the bell variables can be changed to adjust the attribute range for each bin such that the attribute range for each bin is small enough to separate attribute values that should not be binned together. For example, in a particular circuit design a net that has a fanout of 10 may have a drastically different routing topology than a net that has a fanout of 9. In such a scenario, nets that have a fanout of 9 should not be binned together with nets that have a fan-out of 10. Thus, the bell variable D, for example, can be increased to increase the number of bell indices or bins such that nets with a fanout of 9 are binned into their own bin, separate from nets with a fanout of 10.

By automatically deriving the attribute ranges to bin the nets of a circuit design, in one embodiment the system allows different bell shapes to be explored by changing the bell variables to change the number of bell indices, the bell peak, the bell center, and the bell width. This provides an easy way to discover physical attribute trends in a circuit design and allows generation of net routing constraints that are specifically tailored to a particular circuit design based on the specific physical attribute trends that are present in the circuit design.

Referring back to FIG. 4, at block 406, net routing constraints for the circuit design are generated based on the attribute ranges derived during the operations in block 404. In one embodiment, the net routing constraints include pattern-based average scaling factors that are used for calculating routing delay estimates during placement-based optimizations. To generate the pattern-based average scaling factors, in one embodiment, the attribute ranges of different physical attributes are combined together to form a net pattern. That is, an attribute range of one physical attribute corresponding to one bell index (i.e. one bin) of that physical attribute is combined with an attribute range of another physical attribute corresponding to one bell index of that other physical attribute to form a net pattern.

Figure 7:
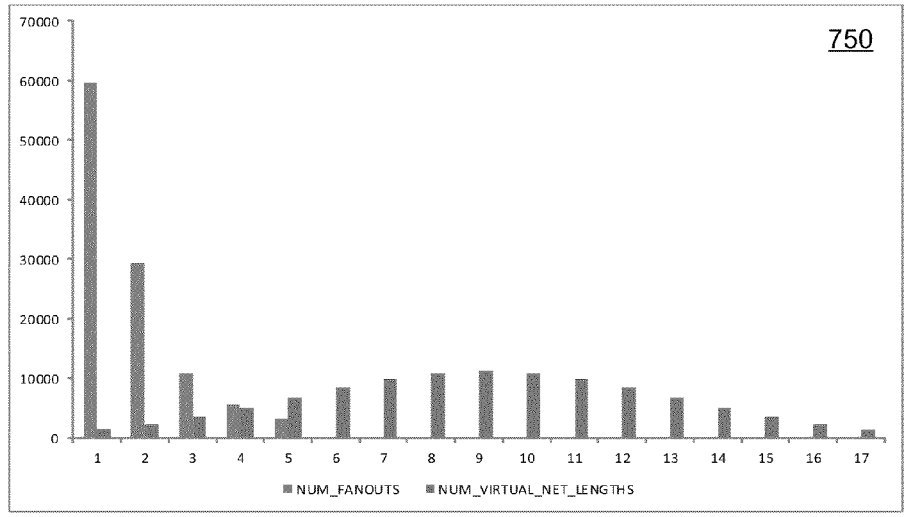
FIG. 7 illustrates exemplary formations of net patterns according to one embodiment of the invention.
Figure 7:
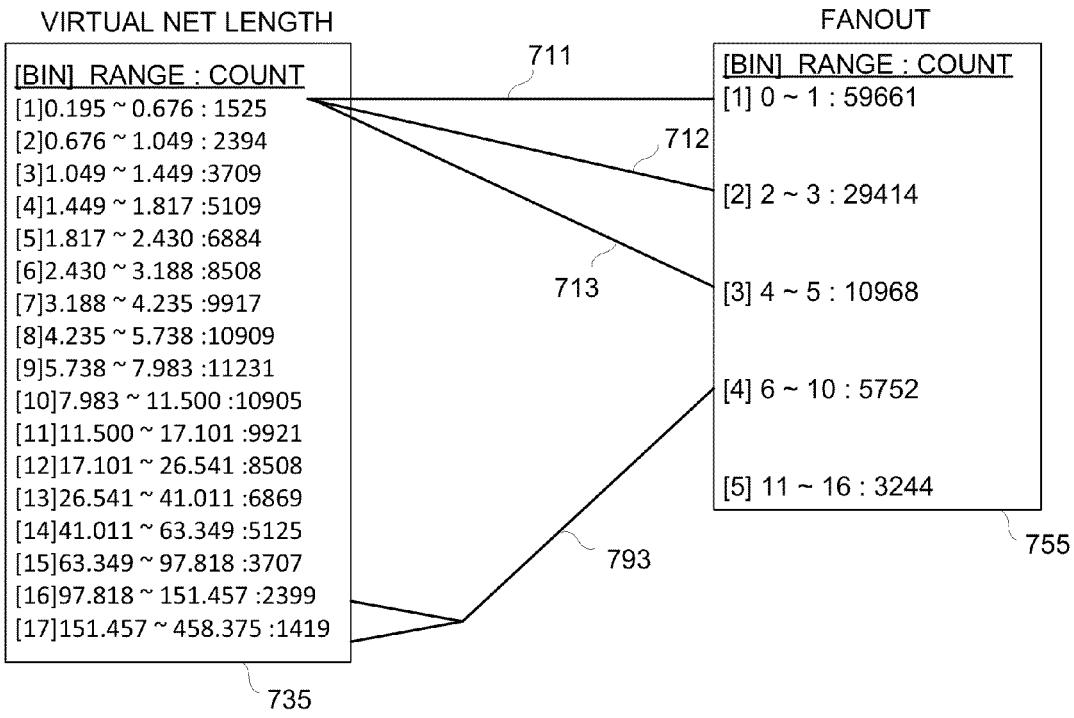

For example, FIG. 7 illustrates the formation of net patterns according to an embodiment. The estimated net length attribute for a circuit design is binned according to table 735 with 17 bell indices. The fanout attribute of the same circuit design is binned according to table 755 with 5 bell indices. The Gaussian distributions for the estimated net length attribute and the fanout attribute are graphically shown in chart 750. The estimated net length attribute range of bell index 1 of table 735 can be combined with the fanout attribute range of bell index 1 of table 755 to form a net pattern 711 corresponding to nets that have a estimated net length of 0.195 to 0.676 and a fanout of 1. The estimate net length attribute range of bell index 1 of table 735 can also be combined with the fanout attribute range of bell index 2 of table 755 to form a net pattern 712 corresponding to nets that have an estimated net length of 0.195 to 0.676 and a fanout of 2 to 3. Similarly, the estimated net length attribute range of bell index 1 of table 735 can be combined with the fanout attribute range of bell index 3 of table 755 to form a net pattern 713 corresponding to nets that have an estimated net length of 0.195 to 0.676 and a fanout of 4 to 5, and so on. Hence, in one embodiment, up to a total of 105 net patterns can be formed (all possible combinations of the estimated net length attribute ranges in the 17 bell indices in table 735 with the fanout attribute ranges in the 5 bell indices in table 755).

In one embodiment, each net pattern can be the combination of attribute ranges of any number of different physical attributes. For example, in one embodiment, a net pattern can be a combination of an estimated net length attribute range, a fanout attribute range, and a bounding box aspect ratio attribute range. In another embodiment, a net pattern can be a combination of a fanout attribute range, a net location attribute range, a bounding box aspect ratio attribute range, and a congestion factor attribute range. Furthermore, a net pattern can also include combining two or more attribute ranges of the same physical attribute, such as when ranges of the same physical attribute are expected to have similar routing delays. For example, referring back to FIG. 7, the estimated net length attribute ranges of bell index 16 and bell index 17 in table 735 can be combined together with the fanout attribute range of bell index 4 in table 755 to form a net pattern 793 corresponding to nets with an estimated net length of 97.818 to 458.375 and a fanout of 6 to 10.

In further embodiments, the net patterns formed by combining the attribute ranges can be specific to a particular net type; that is, in one embodiment, different net types cam be analyzed as separate groups. Different net types may have different routing delays even if the nets have similar geometries due to, for example, different routing layers being used because of the locations of macro-cells. Thus, the above process of deriving attribute ranges and combining attribute ranges can be performed on nets of a certain net type such as I/O nets, macro-cell nets, or standard cell nets to account for the different delay properties. The net patterns formed by combining attribute ranges can also be location specific. For example, a portion of the circuit design may operate at a higher frequency and hence may have different timing requirements. A circuit design can be partitioned into a grid of cell blocks, and the nets in different cell blocks can be analyzed as separate groups.

In one embodiment, the process of deriving attribute ranges and combining attribute ranges can be performed categorically on nets of a certain cell block to form cell block specific net patterns to account for the different timing requirements in the different regions of the circuit design. By allowing the flexibility to form net patterns that are net type specific and/or cell block (i.e. location) specific, and by allowing the net patterns to be formed by combining attribute ranges from the same and/or different physical attributes, the net patterns and the resulting net routing constraints can be specifically tailored for a particular circuit design.

Once the net patterns of a circuit design are formed, a pattern-based average scaling factor for each of the net patterns is computed. The pattern-based average scaling factor can be an average resistance scaling factor, an average capacitance scaling factor, or an average via count scaling factor. In one embodiment, the pattern-based average scaling factor is computed by calculating a scaling factor for each of the nets belonging to a particular net pattern (e.g., each of the nets that have an estimated net length of 0.195 to 0.676 and a fanout of 1 corresponding to net pattern 711), and taking an average of the scaling factors corresponding to that particular net pattern.

Referring back to FIG. 4, in one embodiment, the scaling factor for a particular net is the ratio of the post-route property to the estimated route property of the net, where the route property can be a resistance, capacitance, and/or a via count. In some embodiments, in order to prevent outlier nets from adversely skewing the pattern-based average scaling factor, nets that have scaling factors greater than one or more standard deviations away from the mean of all scaling factors for a particular net pattern are excluded from the average calculation. For example, in one embodiment, scaling factors that are outside of one standard deviation from the mean of all scaling factors for a particular net pattern are excluded from the average calculation. In another embodiment, scaling factors that are outside of two standard deviations from the mean of all scaling factors for a particular net pattern may be excluded from the average scaling factor calculation. The option of excluding scaling factors that are outside of a set standard deviations from the mean of all scaling factors in one embodiment provides another way to specifically tailor the net routing constraints for a particular circuit design. Finally, an adaptive scaling factor pruning process can also be employed; for example, instead of establishing only a mean scaling factor for a small population of nets to abridge its size and adjust the population's scaling factor, the skewness and kurtosis of the entire population can be considered, which can sometimes improve the accuracy of the scaling factor.

In one embodiment, the net routing constraints generated at step 406 also includes exaggerated scaling factors for certain nets. During physical synthesis, a net that is expected to have a high capacitance scaling factor and is very long can be an indication that no possible routing of the net would be able to meet timing constraints. In one embodiment, a net that has a very high capacitance scaling factor and is very long can be optimized away by exaggerating the capacitance scaling factor even more. For example, if a 200 um-long net is expected to have a capacitance scaling factor of 3 or more, alter the scaling factor to be 50. Such a change will promote physical synthesis to split the net into smaller segments, each of which will be more predictable and subsequently scale with increased accuracy, especially when the new, shorter nets match net patterns with highly reliable scaling factors.

In one embodiment, the system may identify nets that have scaling factors above a predefined scaling factor threshold and generate exaggerated scaling factors that are much greater than the actual computed scaling factors to force the identified nets to be reconfigured during placement-based optimizations. In one embodiment, the exaggerated scaling factor of a net is generated by multiplying the actual computed scaling factor for the net by a constant, for example, a constant of 5, 10, 20, 50, or 100. In another embodiment, the exaggerated scaling factor of a net is generated by multiplying the computed scaling factor for the net by a number that increases as the difference between the actual computed scaling factor and the predefined scaling factor threshold increases. For example, if the predefined scaling factor threshold is 2, then the exaggerated scaling factors generated for the actual computed scaling factors of 3, 4, 5, and 6 may be 30 (=3×10), 40 (=4×10), 100 (=5×20), and 300 (=6×50), respectively. The exaggerated scaling factors are then applied to the identified nets during post-route optimizations. In other words, for the identified nets, instead of using the pattern-based average scaling factors computed for net patterns matching the identified nets, the exaggerated scaling factors are applied to the identified nets. As a result, because of the exaggerated scaling factors, high estimated routing delays are calculated for these identified nets to intentionally force the identified nets to be reconfigured as described above.

Furthermore, the net routing constraints generated at step 406 may also include routing layer constraints for certain nets. Nets that have an undesirable scaling factor (e.g., a scaling factor above a predetermined scaling factor threshold, or a scaling factor below a predetermined scaling factor threshold) may indicate potential routing problems because of the large discrepancy between the estimated route property and the post-route property. In one embodiment, the system can identify such nets that have undesirable scaling factors, and generate routing layer constraints that include assignment or restriction of specific routing layers to the identified nets to limit the number of routing layers that the identified nets may be routed on. Limiting the number of routing layers that the net may be routed through helps to reduce the variations in resistance and capacitance, and/or via count that a net may encounter. Thus, for the identified nets that have undesirable scaling factors, this would increase the correlation between post-route delays and estimated routing delays to improve post-route optimizations.

Figure 8:
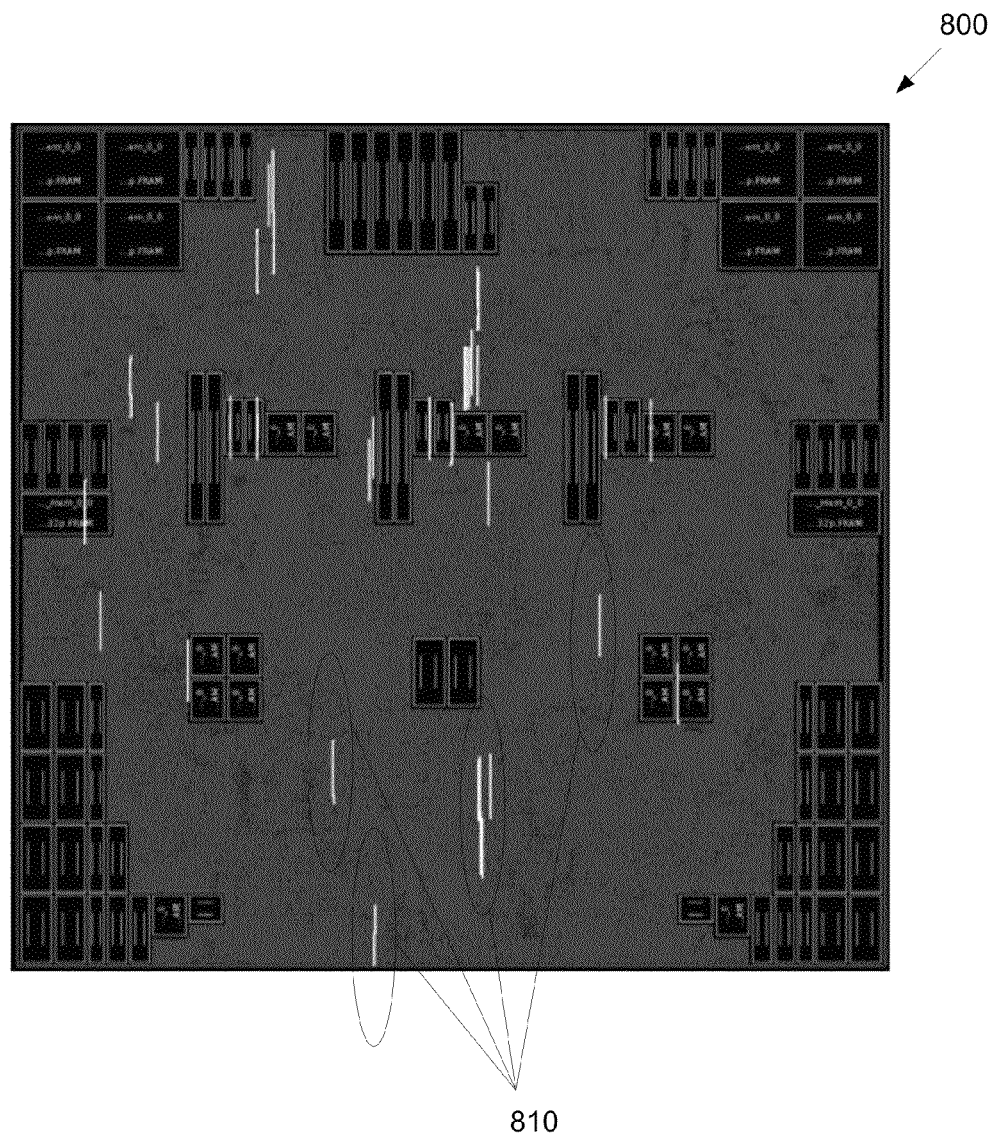
FIG. 8 illustrates an exemplary layout of a circuit design.

Referring back to FIG. 4, at block 408, the net routing constraints generated at step 406 are applied during placement-based optimizations to improve the placement and routing of the circuit design. The pattern-based average scaling factors computed for the net patterns are applied to nets that match the corresponding net pattern. Because of the flexibility to form net patterns by combining any number of attribute ranges from the same and/or different physical attributes, the system enables unique pattern-based average scaling factors to be applied to nets with very specific geometries and physical attributes. To illustrate this, FIG. 8 shows an exemplary circuit design 800. In the circuit design 800, the nets 810 that are highlighted in white match a net pattern. The nets 810 have very similar predicted net lengths, fan-outs, and bounding box aspect ratios. By applying a pattern-based scaling factor that is specific to nets with such specific geometries during post-route optimizations, the estimated routing delay computed for each net is closer to the actual post-route delay because factors that impact the actual routing of the net, such as the geometry and other physical attributes, are taken into account when calculating the estimated routing delays.

The pattern-based average scaling factors, in one embodiment, can be refined during each iteration of the placement-based optimization. As the layout of the circuit design is being changed during placement-based optimization, the arrangement of nets and the physical attributes of the nets in the circuit design may change during the process (e.g., nets may be relocated or be split up into multiple nets). To account for these changes during placement-based optimization, the pattern-based average scaling factors can be adjusted during each iteration and be refined to provide a better snapshot of the current state of the chip layout.

Moreover, and as discussed above, exaggerated scaling factors and routing layer constraints can be applied to individual nets to steer the placement-based optimizations to more significantly modify problematic nets. In other instances, special emphasis is not placed on certain nets. For example, in an embodiment, if the number of nets corresponding to a particular net pattern is below a net count threshold, the pattern-based average scaling factor for that net pattern may in one embodiment be ignored and not applied to nets matching that net pattern during placement-based optimizations. This is done because if the number of nets corresponding to a particular net pattern is low, the pattern-based average scaling factor computed for that net pattern may not be a scaling factor that accurately represents such nets because of the relatively small number of nets. Hence, it may be advantageous to not place any special emphasis on such nets so that no extra optimization effort is applied to these nets, but rather focus nets that are likely to be problematic. By enabling computation of estimated routing delays that are much closer to the actual post-route delays, and by being able to steer placement-based optimizations to apply more effort to problematic nets, the system is able to reach design closure with fewer iterations of placement-based optimizations.

In one embodiment, once a circuit design has reached design closure, the net routing constraints derived for the circuit design can be saved for future use. For example, the net routing constraints can be reused during a redesign of the circuit. A redesign can be a revision of the current circuit design to fix bugs discovered in the field or during testing, or it can be a newer version of the current circuit design such as the next generation of a chip. Once the net routing constraints have been derived for a particular circuit design, a redesign of that circuit can leverage previously generated net routing constraints that are specifically tailored to that circuit. Instead of using default scaling factors during the initial placement and routing, the net routing constraints specifically tailored for circuit design can be applied during the initial placement and routing to potentially shorten the time it takes to reach design closure during physical synthesis of the redesign.

This description and drawings are illustrative of embodiments of the invention and are not to be construed as limiting the invention. Numerous specific details are described to provide a thorough understanding of the disclosed embodiments. However, in certain instances, well known or conventional details are not described in order to avoid obscuring the description of the disclosed embodiments. References to "an" or "one" embodiment in the present disclosure are not necessarily to the same embodiment; such references mean at least one embodiment.

Many of the methods of the disclosed embodiments may be performed with a digital processing system, such as a conventional, general-purpose computer system. Special purpose computers, which are designed or programmed to perform only one function, may also be used.

Figure 9:
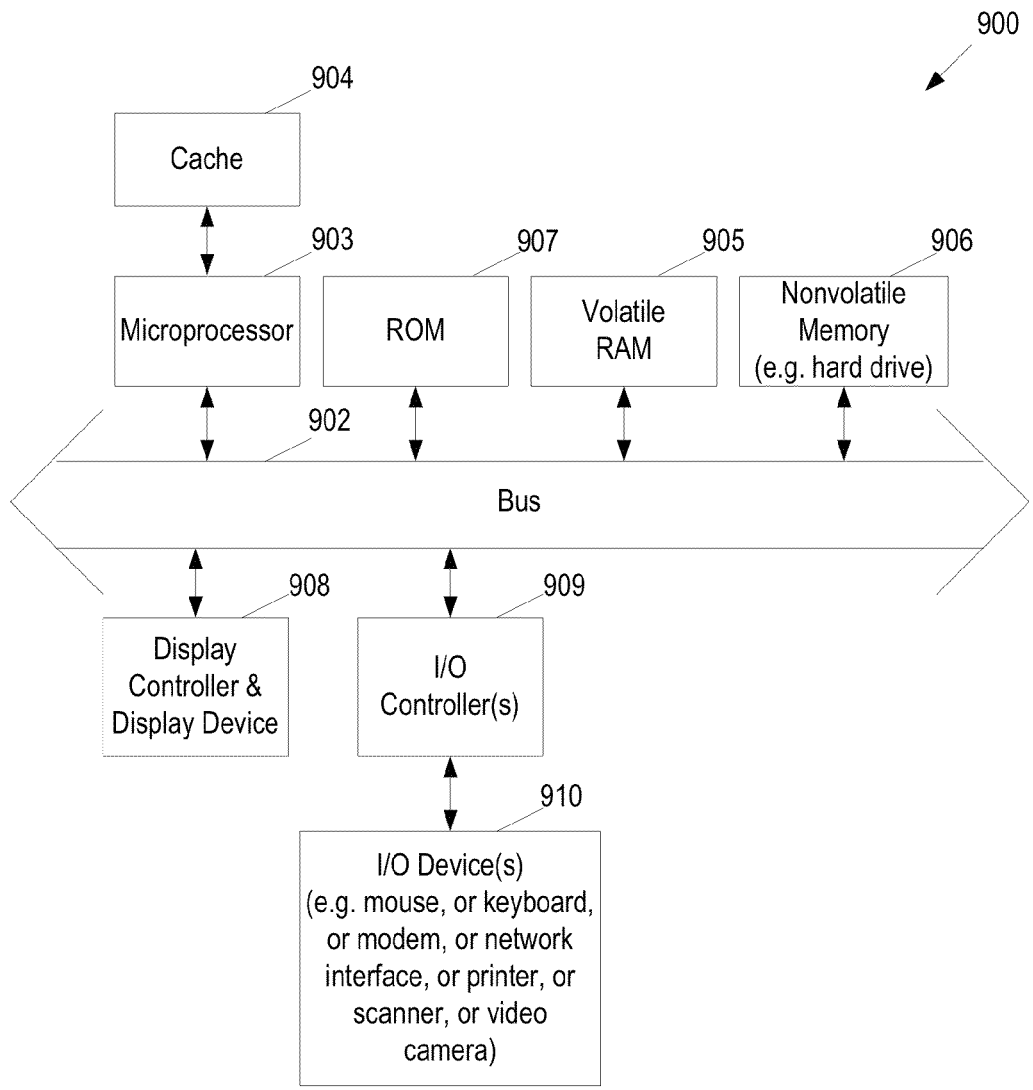
FIG. 9 illustrates a block diagram of an exemplary data processing system configured for use with the disclosed embodiments.

FIG. 9 shows one example of a typical computer system or data processing system that may be used with the disclosed embodiments. For example, in one embodiment the processes described with respect to FIGS. 1 and 4 is operational through the example computing system. However, it is noted that while FIG. 9 illustrates various components of a computer system, it is not intended to represent any particular architecture or manner of interconnecting the components but rather provides an example representation of how the components and architecture may be configured. It will also be appreciated that network computers and other data processing systems that have fewer components or perhaps more components may also be used with the disclosed embodiments. The computer system of FIG. 9 may be any computing system capable of performing the described operations.

As shown in FIG. 9, the computer system 900, which is a form of a data processing system, includes a bus 902, which is coupled to one or more microprocessors 903. In one embodiment, computer system 900 includes one or more of a read only memory (ROM) 907, volatile memory (RAM) 905, and a non-volatile memory (EEPROM, Flash) 906. The microprocessor 903 is coupled to cache memory 904 as shown in the example of FIG. 9. Cache memory 904 may be volatile or non-volatile memory.

The bus 902 interconnects these various components together and in one embodiment interconnects these components 903, 907, 905, and 906 to a display controller and display device 908. The computer system 900 may further include peripheral devices such as input/output (I/O) devices, which may be mice, keyboards, modems, network interfaces, printers, scanners, video cameras and other devices which are well known in the art. Typically, the input/output devices 910 are coupled to the system through input/output controllers 909.

The volatile RAM 905 is typically implemented as dynamic RAM (DRAM) which requires power continually in order to refresh or maintain data in the memory. The non-volatile memory 906 is typically a magnetic hard drive, magnetic optical drive, an optical drive, a DVD RAM, a Flash memory, or other type of memory system which maintains data even after power is removed from the system. Typically, the non-volatile memory will also be a random access memory although this is not required.

While FIG. 9 shows that the non-volatile memory is a local device coupled directly to the rest of the components in the data processing system, it will be appreciated that the disclosed embodiments may utilize a non-volatile memory which is remote from the system, such as a network storage device which is coupled to the data processing system through a network interface such as a modem or Ethernet interface.

The bus 902 may include one or more buses connected to each other through various bridges, controllers and/or adapters as is well known in the art. In one embodiment the I/O controller 909 includes a USB (Universal Serial Bus) adapter for controlling USB peripherals, and/or an IEEE-1394 bus adapter for controlling IEEE-1394 peripherals.

It will be apparent from this description that aspects of the disclosed embodiments may be embodied, at least in part, in software (or computer-readable instructions). That is, the techniques, for example the processes of FIGS. 1 and 4 may be carried out in a computer system or other data processing system in response to its processor, such as a microprocessor, executing sequences of instructions contained in a memory, such as ROM 907, volatile RAM 905, non-volatile memory 906, cache 904 or a remote storage device. In various embodiments, hardwired circuitry may be used in combination with software instructions to implement the disclosed embodiments. Thus, the techniques are not limited to any specific combination of hardware circuitry and software nor to any particular source for the instructions executed by the data processing system. In addition, throughout this description, various functions and operations are described as being performed by or caused by software code to simplify description. However, those skilled in the art will recognize what is meant by such expressions is that the functions result from execution of the code by a processor, such as the microprocessor 903.

A machine readable storage medium can be used to store software and data which when executed by a data processing system causes the system to perform various methods of the disclosed embodiments. This executable software and data may be stored in various places including for example ROM 907, volatile RAM 905, non-volatile memory 906 and/or cache 904 as shown in FIG. 9. Portions of this software and/or data may be stored in any one of these storage devices.

Thus, a machine readable storage medium includes any mechanism that stores any information in a form accessible by a machine (e.g., a computer, network device, personal digital assistant, manufacturing tool, any device with a set of one or more processors, etc.). For example, a machine readable medium includes recordable/non-recordable media (e.g., read only memory (ROM); random access memory (RAM); magnetic disk storage media; optical storage media; flash memory devices; etc.).

The detailed description of embodiments of the invention makes reference to the accompanying drawings in which like references indicate similar elements, showing by way of illustration specific embodiments of practicing the invention. Description of these embodiments is in sufficient detail to enable those skilled in the art to practice the invention. One skilled in the art understands that other embodiments may be utilized and that logical, mechanical, electrical, functional and other changes may be made without departing from the scope of the present invention. The detailed description is, therefore, not to be taken in a limiting sense, and the scope of the present invention is defined by the appended claims.

References within the specification to "one embodiment" or "an embodiment" are intended to indicate that a particular feature, structure, or characteristic described in connection with the embodiment is included in at least one embodiment of the present invention. The appearance of the phrase "in one embodiment" in various places within the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Some portions of the detailed description were presented as procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is conceived to be a self-consistent sequence of steps or instructions leading to a desired result. The steps are those requiring physical manipulations of physical quantities. Usually, though not necessarily, these quantities take the form of electrical or magnetic signals of a computer readable storage medium and are capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "processing" or "accessing" or "analyzing" or "storing" or "performing" or the like, refer to the action and processes of a computer system, or similar electronic computing device that manipulates and transforms data represented as physical (electronic) quantities within the computer system's registers and memories and other computer readable media into other data similarly represented as physical quantities within the computer system memories or registers or other such information storage, transmission or display devices.

In the foregoing specification, the disclosed embodiments have been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method for improving physical synthesis of a circuit design, the method comprising:
    analyzing, by a data processing system, post-route information of nets in the circuit design, wherein the post-route information includes, for each of the nets in the circuit design, a predicted route property, a post-route property, and a physical attribute for the net;
    categorizing the nets in the circuit design into a plurality of net patterns by statistically analyzing the physical attribute;
    determining a scaling factor for a net pattern by computing an average of scaling factors for a plurality of nets matching the net pattern based on the predicted route property and the post-route property, wherein a scaling factor for each net of the plurality of nets is a ratio of the post-route property to the predicted route property for the net; and
    applying the scaling factor for the net pattern to nets matching the net pattern during placement-based optimizations of the circuit design.

2. The method of claim 1, wherein the physical attribute comprises at least one of a fanout, a net length, a bounding box attribute, a net location, a net type, a congestion factor, a blockage overlap ratio, and a slack value.

3. The method of claim 1, wherein the predicted route property is one of an estimated capacitance, an estimated resistance, or an estimated via count, and the post-route property is one of a post-route capacitance, a post-route resistance, and a post-route via count.

4. The method of claim 1, wherein the statistically analyzing comprises categorizing the nets in the circuit design into a Gaussian distribution for the physical attribute, the Gaussian distribution manipulated based on a set of bell variables comprising one or more of: a number of bell indices; a bell peak; a bell center; and a bell width.

5. The method of claim 1, wherein the categorizing the nets comprises combining attribute ranges of different physical attributes to form the plurality of net patterns.

6. The method of claim 1, wherein the categorizing the nets comprises combining two or more attribute ranges of the same physical attribute.

7. The method of claim 1, wherein the scaling factor for the net pattern is ignored during the placement-based optimizations if a number of nets matching the net pattern is below a net count threshold.

8. The method of claim 1, wherein the plurality of net patterns are net type specific.

9. The method of claim 1, wherein the circuit design is partitioned into cell blocks, and the plurality of net patterns are cell block specific.

10. The method of claim 1, wherein scaling factors that are greater than at least one standard deviation away from a mean of the scaling factors of all nets within the net pattern are excluded from the average computation.

11. The method of claim 1, wherein the determining the scaling factor comprises:
    identifying nets that have a scaling factor above a predefined scaling factor threshold; and
    generating exaggerated scaling factors for the identified nets, wherein the exaggerated scaling factors are applied to the identified nets during the placement-based optimizations to force the identified nets to be reconfigured during the placement-based optimizations.

12. The method of claim 11, wherein the identified nets are reconfigured by at least one of assigning net routing layer constraints to the identified nets or inserting one or more buffers to split up the identified nets.

13. The method of claim 1, wherein the determining the scaling factor includes:
    identifying nets that have an undesirable scaling factor; and
    generating routing layer constraints for the identified nets, wherein the routing layer constraints are applied to the identified nets during the placement-based optimizations to force the identified nets to be routed on routing layers according to the routing layer constraints during the placement-based optimizations.

14. The method of claim 1, wherein the applying the scaling factor for the net pattern to nets matching the net pattern comprises estimating route delays for the nets matching the net pattern using the scaling factor.

15. A non-transitory computer-readable storage medium storing instructions thereon, the instructions when executed by a processor causing the processor to perform a method comprising the steps of:
    analyzing post-route information of nets in the circuit design, wherein the post-route information includes, for each of the nets in the circuit design, a predicted route property, a post-route property, and a physical attribute for the net;
    categorizing the nets in the circuit design into a plurality of net patterns by deriving a set of attribute ranges for the physical attribute;
    generating a net routing constraint for a net pattern by computing an average of scaling factors for a plurality of nets within the net pattern, wherein a scaling factor for each net of the plurality of nets is a ratio of the post-route property to the predicted route property for the net; and
    applying the net routing constraint for the net pattern to nets matching the net pattern during placement-based optimizations.

16. The non-transitory computer-readable storage medium of claim 15, wherein the set of physical attributes include at least one of a fan-out, a net length, a bounding box attribute, a net location, a net type, a congestion factor, a blockage coverage ratio, or a slack value.

17. The non-transitory computer-readable storage medium of claim 15, wherein the average of the scaling factors of the net pattern is applied to nets matching the net pattern during the placement-based optimizations.

18. The non-transitory computer-readable storage medium of claim 15, wherein the categorizing the nets in the circuit design into the plurality of net patterns comprises combining attribute ranges of different physical attributes to form the plurality of net patterns, wherein a subset of the attribute ranges are excluded from the combination.

19. A digital processing system comprising:
    means for analyzing post-route information of nets in the circuit design, wherein the post-route information includes, for each of the nets in the circuit design, a predicted route property, a post-route property, and a set of physical attributes for the net;
    means for categorizing the nets in the circuit design into a plurality of net patterns by deriving a set of attribute ranges for the physical attribute;
    means for generating a net routing constraint for the circuit design based on a net pattern by computing an average of scaling factors for a plurality of nets within the net pattern, wherein a scaling factor for each net of the plurality of nets is a ratio of the post-route property to the predicted route property for the net; and
    means for applying the net routing constraint to nets matching the net pattern during placement-based optimizations.

20. The digital processing system of claim 19, wherein the average of the scaling factors of the net pattern is applied to nets matching the net pattern during the placement-based optimizations.

21. The digital processing system of claim 19, wherein the means for generating the net routing constraint further comprises means for excluding a subset of the scaling factors that do not meet a criteria.

22. The digital processing system of claim 19, wherein the means for applying the net routing constraint comprises means for estimating route delays using the net routing constraint.

* * * * *